United States Patent
Marso et al.

[11] Patent Number: 5,831,329
[45] Date of Patent: Nov. 3, 1998

[54] LAYERED SYSTEM WITH AN ELECTRICALLY ACTIVATABLE LAYER

[75] Inventors: Michel Marso, Jülich; Andreas Schüppen, Ulm; Herbert Münder, Bergheim; Michael Götz Berger, Wachtberg-Pech; Hans Lüth, Aachen, all of Germany

[73] Assignee: Forschungszentrum Julich GmbH, Julich, Germany

[21] Appl. No.: 532,638

[22] PCT Filed: Apr. 2, 1994

[86] PCT No.: PCT/DE94/00383

§ 371 Date: Oct. 3, 1995

§ 102(e) Date: Oct. 3, 1995

[87] PCT Pub. No.: WO94/23456

PCT Pub. Date: Oct. 13, 1994

[30] Foreign Application Priority Data

Apr. 7, 1993 [DE] Germany .................. 43 11 388.3

[51] Int. Cl.[6] ............. H01L 23/48; H01L 23/52; H01L 29/40
[52] U.S. Cl. .................. 257/750; 257/88; 257/329
[58] Field of Search ............ 257/88, 192, 197, 257/329, 331, 750

[56] References Cited

U.S. PATENT DOCUMENTS

| | | | |
|---|---|---|---|
| 3,388,255 | 6/1968 | May | 257/88 |
| 4,529,997 | 7/1985 | Jay et al. | 257/266 |
| 5,332,681 | 7/1994 | Tonucci et al. | 437/16 |

FOREIGN PATENT DOCUMENTS

| | | | |
|---|---|---|---|
| 2 646 963 | 11/1990 | France . | |
| 61-184885 | 8/1986 | Japan | 257/331 |
| 1120074 | 5/1989 | Japan . | |
| WO 84/04197 | 10/1984 | WIPO . | |

OTHER PUBLICATIONS

Submicrometer Silicon Permeable Base Transistors With Buried $COSI_2$ Gates, by Schüppen et al., published in Electronic Letters 21 Jan. 1993 vol. 29, No. 2, pp. 215–217.

Primary Examiner—Olik Chaudhuri
Assistant Examiner—Howard Weiss
Attorney, Agent, or Firm—Herbert Dubno

[57] ABSTRACT

An electronic component has electrically activatable layer, e.g. in electroluminescent layer of porous silicon on a body of which two multiarthogonal grids are buried. A conductive layer on the electrically activatable layer forms a drain and another conductor forms the source, the grid bars being independently energizable to form current channels through the electrically activatable layer.

6 Claims, 5 Drawing Sheets

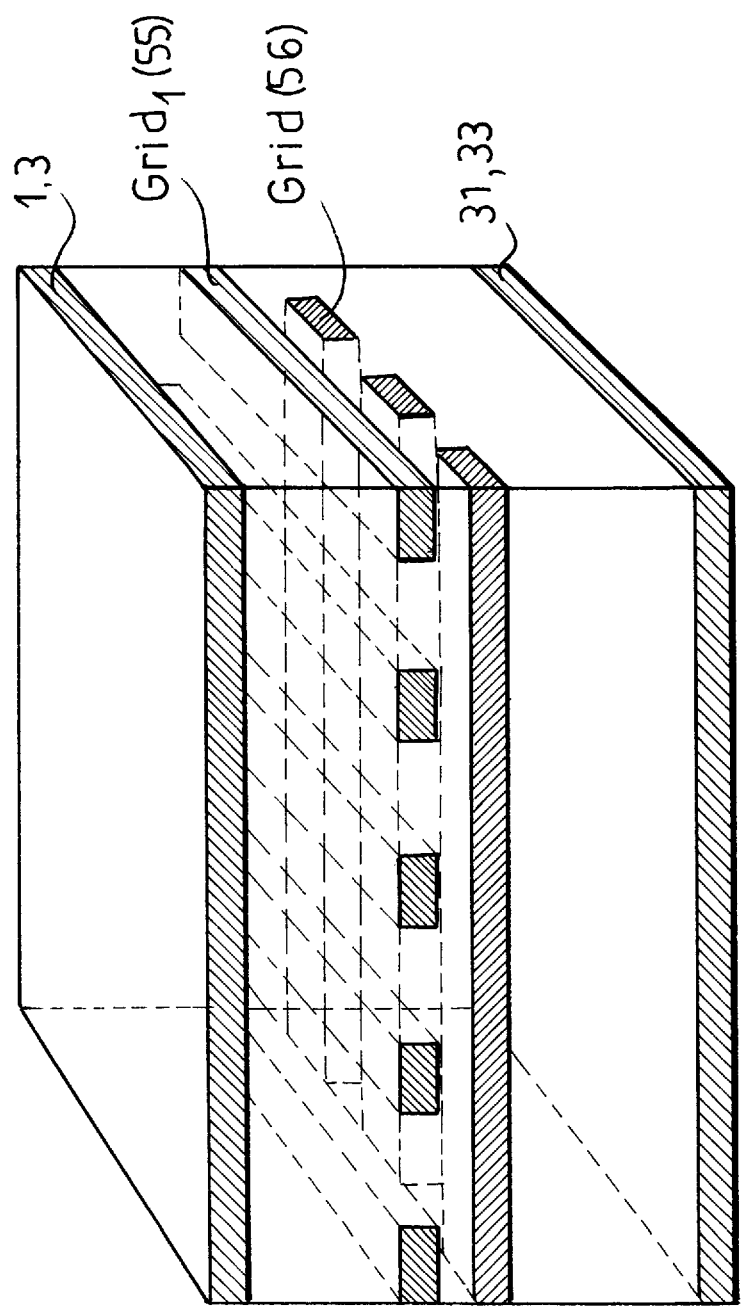

LAYERED SYSTEM WITH AN ELECTRICALLY ACTIVATABLE LAYER

CROSS REFERENCE TO RELATED APPLICATION

This application is a national phase of PCT/DE 94/00383 filed 2 Apr. 1994 and based, in turn, on German national application P 43 11388.5 of 7 Apr. 1993 under the International Convention.

FIELD OF THE INVENTION

The invention relates to a layered system, especially for use in the microelectronics or microtechnology fields, having an electrically activatable layer which has at least one contact electrode extending over and connected to at least a part of a layer surface of the first layer side.

BACKGROUND OF THE INVENTION

Such a layer system is known from IEEE electron device letters, volume 12, number 12, December 1991, pages 691–692. In part this deals with a layered system with a porous silicon layer having on its upper layer side a gold contact electrode extending over the layer surface and connected thereto, the gold contact electrode having a thickness of 12 nm. On the second layer side, the porous silicon layer is connected with a silicon wafer which has on its other (back) side a further gold contact in the form of a 300 nm thick layer. Upon application of a sufficient voltage or by passage of a sufficient electric current between the two electrodes, an electroluminescence can be observed in the porous silicon layer such that light emission is visible through the 12 nm thick gold layer. For improved emission, this gold contact can be structured with openings A drawback of this known layered system is, however, that the electrical activation of the porous silicon layer, because of the large-area contact electrodes both on the upper surface of this layer and on the underside of the silicon layer, allows only a large-area electrical activation in the layer.

OBJECT OF THE INVENTION

It is an object of the present invention to provide a layered system of the aforedescribed type in which the electrically-activatable layer is controllable in a laterally-limited manner.

SUMMARY OF THE INVENTION

The object of the invention is achieved with a layered system especially for use in the microelectronic or microtechnology field, with an electrically-activatable layer which has on a first layer side extending over at least a part of the layer surface, a contact electrode connected therewith. On the second layer side of the layer at least in the layer region of the first contact electrode a multiplicity of transistor functions are provided, whereby one of the ends of the respective controllable current channels (controlled by current (I)), of the respective transistor functions is connected with the layer. Thus the electrically-activatable layer has on the first layer side, a contact electrode which at least extends over a part of the layer surface. It is advantageous if this extends over an as wide as possible part of this layer up to a complete coating of this first layer side.

On the second layer side of the electrically-activatable layer the layered system of the invention is provided at least in the layer region of the first contact electrode, with a plurality of transistor functions, preferably a multiplicity of transistor functions. One of the ends of the respective controllable-current-feeding current channels is then connected with the electrically-activatable layer. These features enable lateral limiting of the current carriers on the second layer side, namely, in the region of the respective current channel up to the electrically-activatable layer so that the laterally-limited layer region included between the contact electrode on the first layer side and the respective contact location of the individual current channel can be electrically activated. Through a multiplicity of transistor functions on the second layer side, a pattern of many laterally-limited layer regions each controllably-defined by means of the control electrodes of the transistor functions (source S, drain D, gate G) are enabled.

In particular, the electrical activation generates an electroluminescence in the electrically-activatable layer. It is, however, possible alternatively by electrical activation of the layer to excite fluorescence to enable read-out of photodiodes to generate local chemical deposition, or to produce localized effects, for example, from porosity superlattices. The system of the invention is not limited to the electrical activation of an electroluminescence.

Advantageously, the plurality of transistor functions is provided as a transistor array in the layered system. In this manner a systematic arrangement of the transistor functions can be achieved on the second layer side of the electrically-activated layer.

A plurality of transistor functions can be provided at least by a transistor with a perpendicular current channel. It is, in this case, advantageous to provide the transistor as a permeable base transistor or as a heterobipolar transistor as is known, for example, from Materials Science and Engineering, B12 (1992), pages 156–160.

The layered system of the invention is especially advantageous when the electrically-activatable layer extends as a large-area electrode over a plurality of transistor functions and it forms one of the control electrodes, be it the drain or the source, for the respective transistor functions.

At least in part the respective opposite end of the current channels can be provided with a further electrically-activatable layer connected with these channels. In this manner a layer system is achieved with a defined lateral electrical activation of one layer in a mirror-reversed patterning of the pattern of the electrically-activated further layer deposed on the opposite side.

A preferred embodiment of the layered system of the invention provides that the material for the electrically-activated layer is a material with electroluminescent characterization. It can be advantageously a porous silicon. Further materials having a nanocrystalline structure with electroluminescent characteristics are not, however, excluded.

In an advantageous manner the layered system of the invention is provided on the first layered side with a contact electrode which is an electrolytic contact electrode. By use of an electrolyte as a contact electrode, in a known manner, the electrical activation in the case of electroluminescence can be advantageously an unclouded light emission from the first layer side of the electrically-activated layer. With use of an electrolyte as one such counter electrode, it is possible in addition to enable a defined local chemical precipitation from the liquid electrolyte.

In an embodiment of the invention the control electrode has a gate (G) function which is provided as a gridlike layer structure. This gridlike layer structure can be configured of a sieve shape or another shape. Such a structure as the control electrode enables the second of the respective space charge zones in several current channels simultaneously. By application of a blocking potential, the space charge zones constrict the respective current channels. In the conduction direction, the space charge zones are reduced to the extent that a current of charge carriers is enabled to flow through the current channel. Usually the charge carrier on the transport is an electron transport, although it can also involve a hole transport.

An embodiment of the invention can have the gridlike layer structure formed from two layers which are located at different distances from the layer side of the electrically-activatable layer. These two layers substantially parallel to the layer side of the electrically-activatable layer are provided with lateral fingerlike structures. With a mutually orthogonal orientation of these structures, they form in their totality a matrix of mutually parallel current channels as a current channel matrix whereby in an especially advantageous manner the elements of these two layers individually are provided as controllable finger elements with current channels individually controllable within the gridlike layer structure. As a result, with the aid of a plurality of such laterally-bounded adjustable electrical activations in the electrically-activatable layer, an optionally definable activation pattern can be produced. It is conceivable in the case of use of the electrical activation in the form of an electroluminescence to use such a layer system for generating images on the first layer side of the electrically-activatable layer so that the images of such a layer system with an electrically-activatable layer can be television picture screens or comparable imaging devices.

For the case that at least the layer of the gate (G) closest to the electrical activation layer is so close to the electrical activation layer that the space charge zones extend to the second layer side, one has an especially advantageous embodiment of the claimed invention. With this feature, a widening of the current channel in the direction of the second layer side of the electrically-activated layer can be controlled with reduction to avoidance of such enlargement. Without limitation, alternatively instead of the latter, a predetermined doping of the material current channel can be provided which, in the direction of the second layer side has diminished or decreasing doping to reduce the spread of the current channel in this region. In both cases it can advantageously be achieved that a laterally-limited defined activation of the active layer is effected in a yet smaller lateral region which, with a multiplicity of transistor functions, gives rise to an improved resolution of the electrical activation pattern.

Finally it can be advantageous to configure the layered system of the invention so that as the electrically-activatable layer, a quantum dot array is provided.

To the extent that an electroluminescence is achieved in the electrically-activated layer, with the layered system of the invention and even with those which utilize a contact electrode in the form of an electrolyte, inexpensively produced large area light arrays can be formed. No subsequent structuring of porous silicon then is required.

The layered system of the invention can be fabricated in silicon or gallium arsenide technology. Thus the control electrodes of the respective transistor functions can be fabricated from metal or metallic suicides or even contra-doped materials. With gates as the control electrode, a Schottky or also a PN junction can be provided. It is possible, as material for the source-control electrode, to produce highly doped semiconductive material, especially of a gallium arsenide or also a silicon basis.

The invention layer system can be constructed from an electrically-activatable layer of electroluminescing AlGaAs—GaAs or also of semiconductive $\beta$-FeSi$_2$ so that, with the aid of the transistor arrays, locally controlled, these layers can form lamps with photodiode functions. As further functions which can be locally effected at the electrically-activatable layer, local fabrication of porous silicon can be considered which advantageously form porosity superlattices. In total this results in a layered system according to the invention which enables materials, with advantageously large-area contacts, to be electrically locally controlled, preferably with the aid of a two-dimensional transistor array. This transistor array is located below the material and can be fabricated before the application of the material. It permits an epitactic, monocrystalline application of further layers, (e.g. silicon for the production of porous silicon). The transistor array can be controlled through lateral terminals in a column manner and/or a row manner. A control logic can be integrated without problems on the semiconductor chip. The process is very simple from the concept on and can be carried out by standard prevalent technological steps. As a whole it provides with the layered system of the invention a three-dimensional integration in the realm of microelectronics.

BRIEF DESCRIPTION OF THE DRAWING

The above and other objects, features, and advantages will become more readily apparent from the following description, reference being made to the accompanying drawing in which:

FIG. 2b is a cross section through the layered system of the invention according to FIG. 1 and FIG. 2a;

FIG. 4 is a perspective view of the layered system of the invention with the drain and source as large-area electrically active layers bounding the layered system;

In FIG. 1, the layered system of the invention is shown in perspective view with a large-area electrode of an active layer 1 and contact electrode 3 not shown in detail. Further indicated in FIG. 1 is a gridlike control electrode of two individual layers 55 or 56 with the striplike elements 57, 58, 59 or 67, 68, 69, designated as grid 2 or grid 1 in the Figure. The layers 55 and 56 are at different spacings from the electrically-activatable layer 1 and are oriented mutually perpendicularly to one another. Thus they form a matrix of mutually substantially parallel individually elements 57, 58, 59, 67, 68 or 69, as required, individually controllable current channels controlled by the elements 57–59 and 67–69. Each individually controllable current channel enables a laterally highly limited activation of the layer 1 so that the totality of such current channels or multiplicity of such current channels or transistor functions enables the setting of an activation pattern in the layer 1 depending upon the scanning or boundary conditions.

FIG. 2a shows schematically a gridlike layer structure with the aid of two layers 55 and 56 of which the striplike elements of the finger formed layers 55 and 56 are visible from above. Between the individual strips there are formed individual current channels as a consequence of the orthogonal arrangement of the grid 1 to the grid 2 forming a matrix of openings in space defining the individual current channels.

Figure 1:
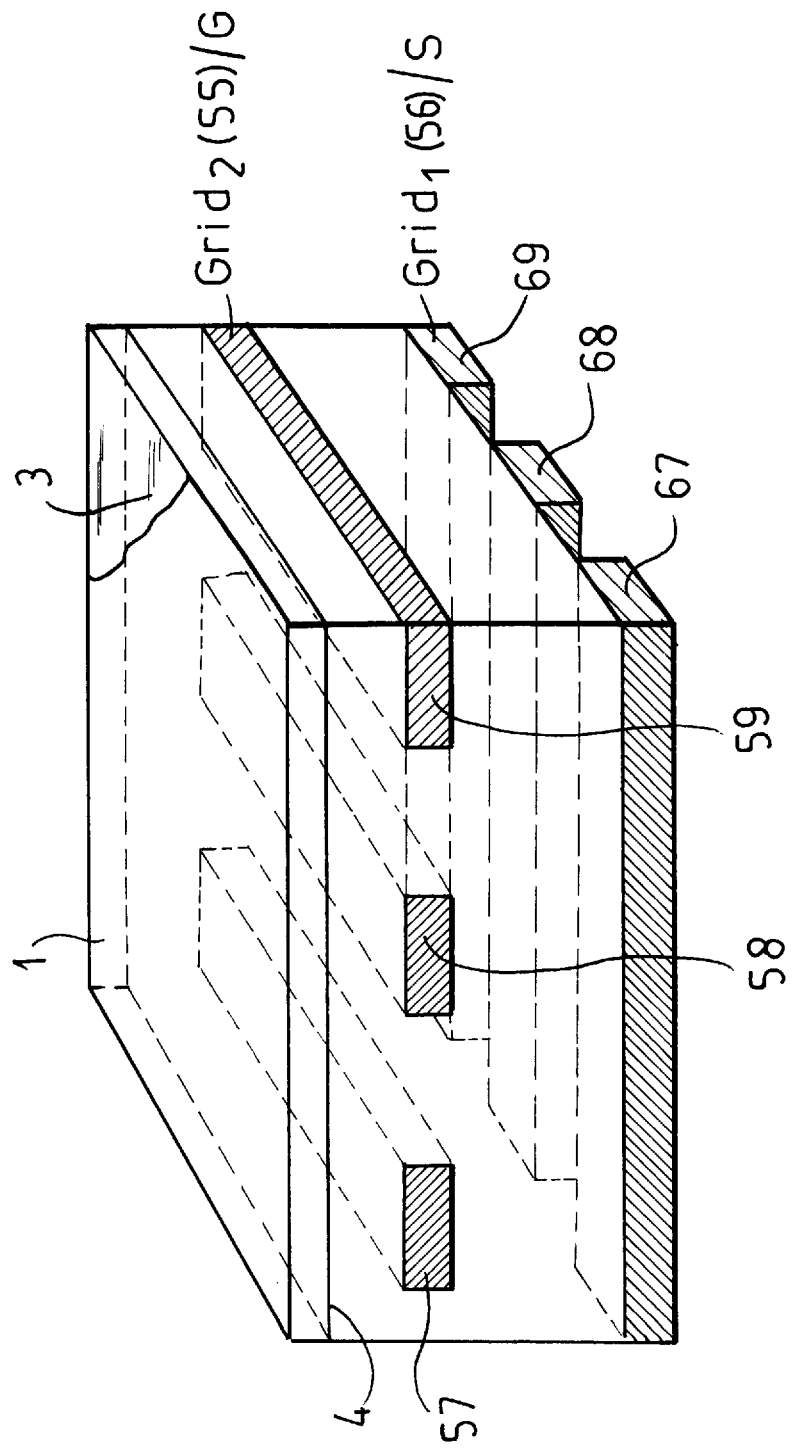
FIG. 1 is a perspective view of the layered system of the invention, with a large area electrode as active layer and contact electrode with two electrode grids, one of which is provided for the transistor functions.
Figure 2A:
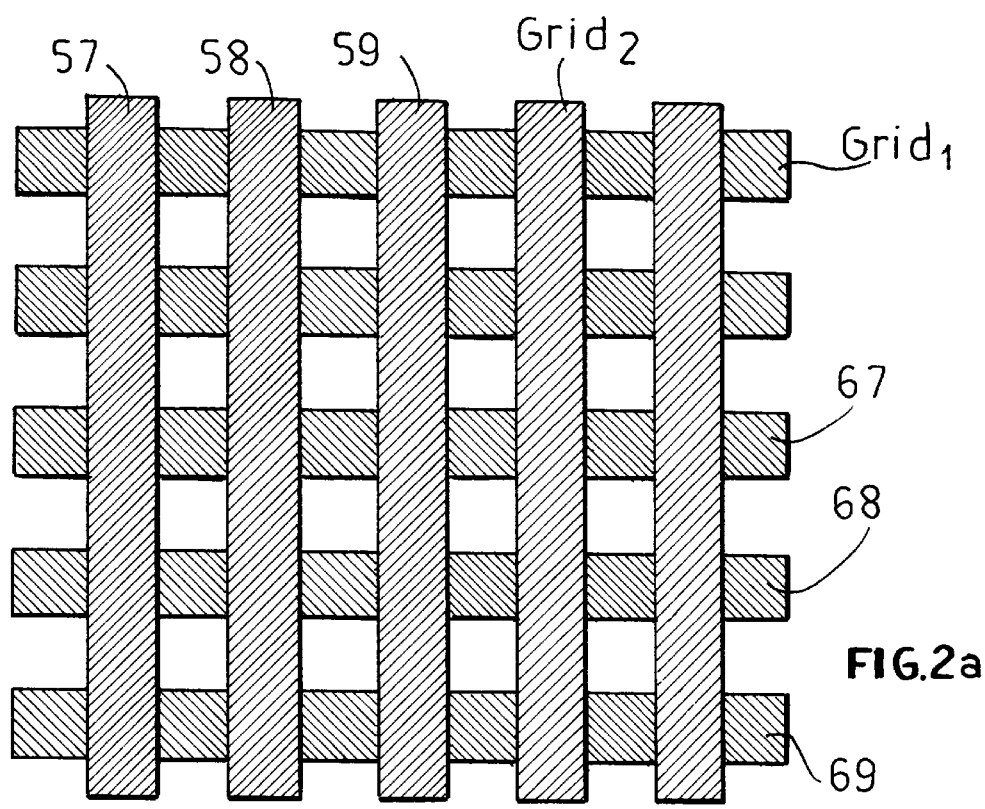
FIG. 2a is a plan view a gridlike layered structure as the gate within the layered system of the invention, comprised of two strip grid layers grid 1 and grid 2.
Figure 2B:
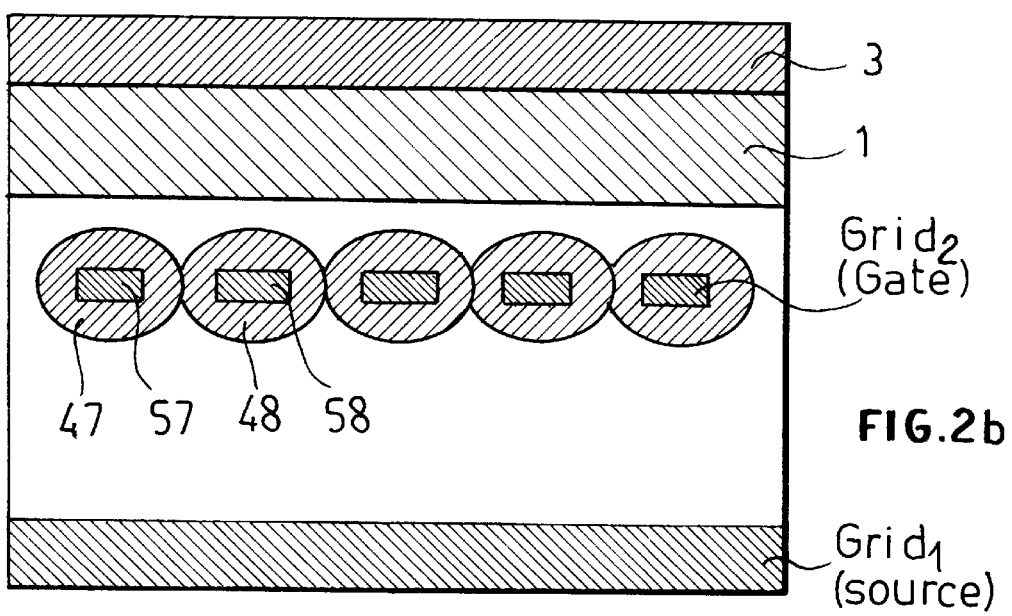

A cross section of the layered system of the invention perpendicular to the layer orientation is shown in FIG. 2*b*. It is formed from top to bottom of a contact electrode 3 in the form of an electrolyte, the electrically-activatable layer 1, here a large-area electrode of porous silicon with a drain function. Therebelow and of a base of silicon, is a PBT with a gridlike gate (in the sense of the grid 2 of FIG. 2*a*) with the individual strip elements 57, 58, 59 . . . surrounded by space charge zones 47, 48, 49. . . . On the underside as a source, the grid 1 is provided orthogonal to the grid 2. In the schematic illustration of FIG. 2*b*, the space zones as a result of suitably applied blocking voltages are so formed that a charge carrier current I between the strip elements 47, 48, 49, cannot pass to the porous silicon so that an activation, depending upon the choice of the porous silicon as an activatable layer, through electroluminescence with light emission in the layer 1 does not occur.

Figure 3A:
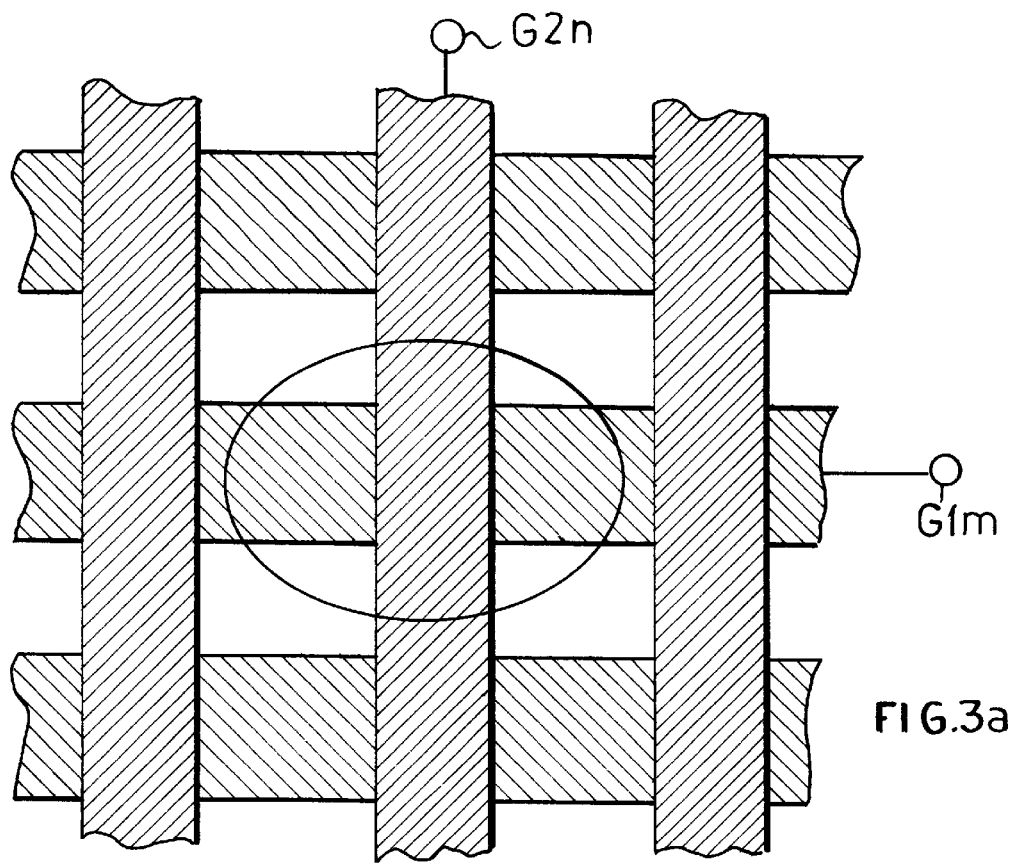
FIG. 3a is a plan view.
Figure 3B:
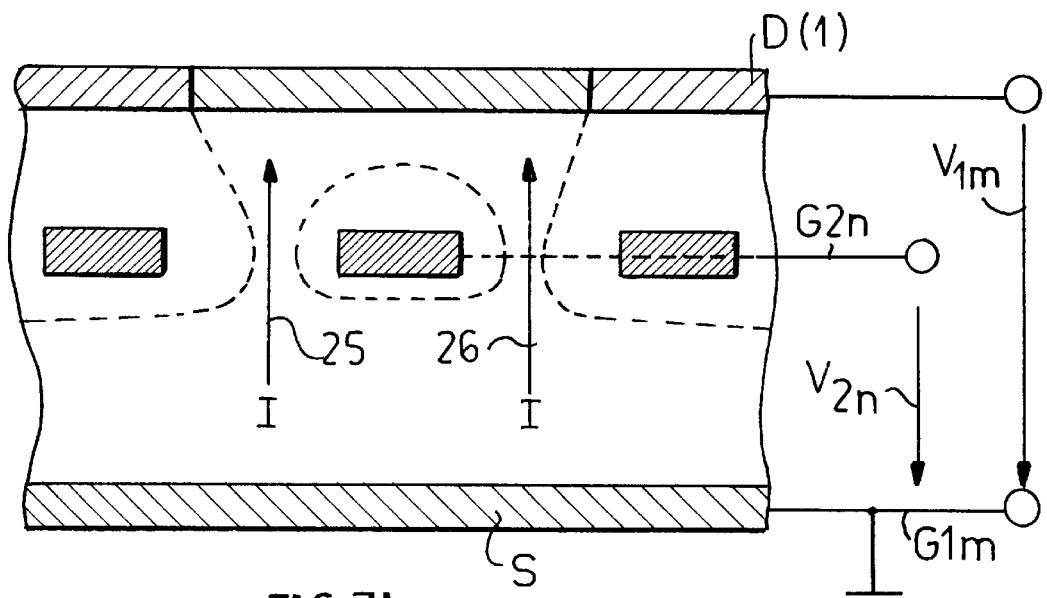
FIG. 3b is a cross section diagrammatically space charge zones in the region of the gate control electrode in the layered system of the invention.

In FIG. 3*a*, the gridlike structure has one of its strip elements, in this Figure designated at G2n and a strip element orthogonal thereto and independently controllable at G1m individually controlled so that within the matrix of the current channels individually selected current channels are switched to be current-conducting or currentless. In FIG. 3*b* a vertical section through this system is shown. The space charge zones around the middle strip elements are so constructed by suitable control that a charge carrier current I can pass through the current channels 25 or 26 from the source S, through the striplike layer G2 of the active layer 1 here indicated as a drain D. With the aid of a contact electrode 3 not separately illustrated in this schematic showing, on the upper side of the active layer 1, in the region of the engagement of the current channels 25, 26 with the layer 1, a region of this layer (here indicated by wide hatching) and laterally-limited, is activated.

FIG. 4 shows the layered system of the invention in which the electrically-active layers 1 and 31 bounding the two sides of the layered system are formed as drain and source. Neither in this or in the other Figures is each individual transfer function indicated by detailing the materials used.

Figure 5A:
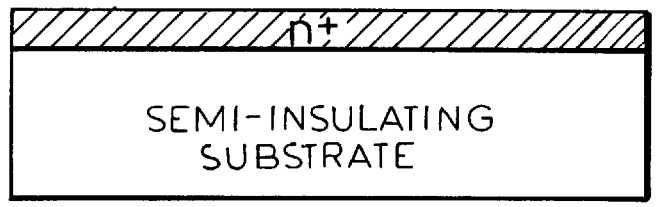
FIGS. 5a–d show the sequence in fabrication of the layered system of the invention.

The sequence in fabricating the layered system of the invention is schematically illustrated in FIGS. 5*a*–*d*. On the semi-insulating substrate with the aid of an N⁻ implantation, a first fingerlike layer is formed in the undoped silicon substrate with the aid of a strip mask. Thereafter by annealing any implantation defects are healed (FIG. 5*a*).

Figure 5B:
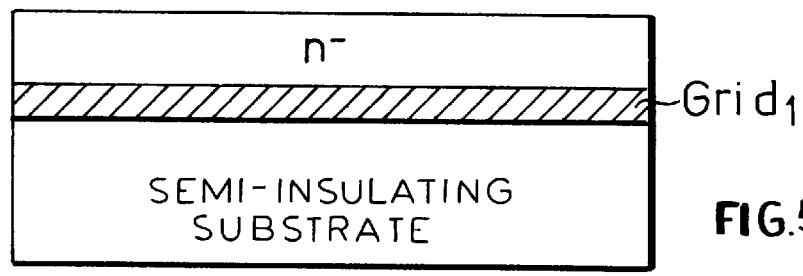
Figure 5C:
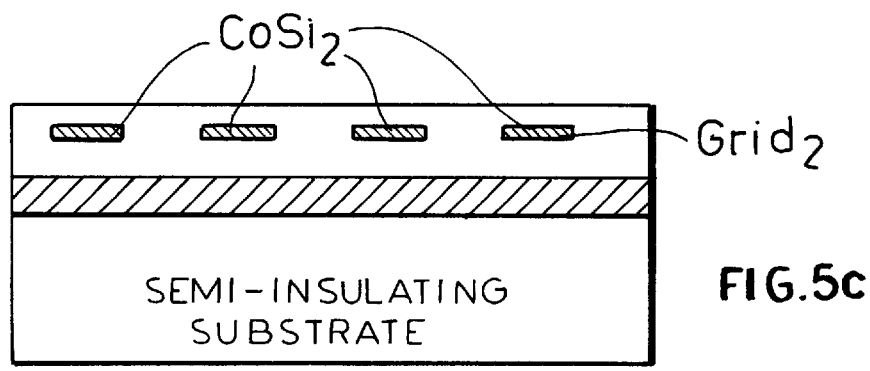
Figure 5D:
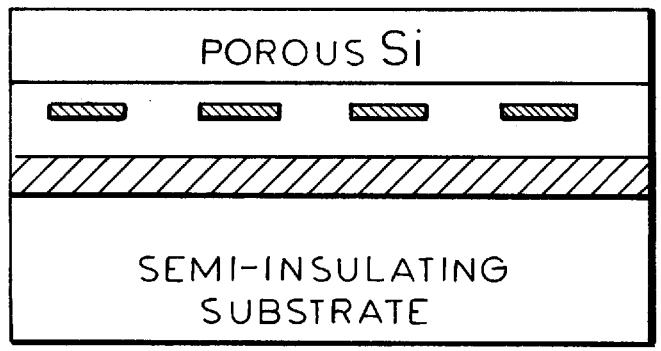

In a further step an N⁻ layer is applied on the N⁺ layer (FIG. 5*b*). The N⁺ layer is thus formed as a grid 1. With the aid of a cobalt-high dosage-ion implantation, using a suitable strip mask, a further fingerlike structure, here as grid 2, is formed. The grid 2 acts functionally as a metallically-conducting gate control electrode buried in the N⁻ epitactic layer. The strip configuration of the grid 2 is orthogonal to the strip configuration of the grid 1 (FIG. 5*c*). To produce the monocrystalline buried cobalt silicide, a brief annealing is required. Then further N⁻ epitaxy is effected. In a known manner porous silicon is finally applied to the prior structure with transistor functions. It is self-understood that here, although not shown in detail, that upon the porous silicon layer a further contact electrode can be provided. In the case of utilization of electroluminescent characteristics of the material of the selected active layer, a liquid electrolyte can be used as a contact electrode on top of the previously produced layer system. Drain, source and gate of the layered system of the invention can be obtained by suitable choice of the conductivity characteristics depending upon the desired boundary conditions and can be individually controllable.

We claim:

1. An electronic component comprising:

a body of a semi-insulating material capable of forming current channels therein;

an electroluminescent electrically activatable layer of porous silicon on said body;

a electrically conductive layer on said electrically activatable layer and forming a transistor-function drain;

a first grid buried in said body and formed by a coplanar array of mutually parallel conductors;

a second grid buried in said body and formed by a coplanar array of mutually parallel conductors spaced between said first grid and said electrically activatable layer and orthogonal to the conductors of the first grid;

another electrically conductive layer on said body forming a transistor-function source; and means for independently energizing the conductors of said first grid and the conductors of said second grid whereby a multiplicity of separately controllable transistor functions are formed by said grids in the form of respective permeable base bipolar transistors or heterobipolar transistors creating controllable current channels from said source to said drain through said electrically activatable layer, thereby activating same.

2. The component defined in claim 1 further comprising another electrically activatable layer on said body activatable by said current channels.

3. The component defined in claim 1 wherein the porous silicon has a monocrystalline structure.

4. The component defined in claim 1 wherein said electrically conductive layer is a layer of an electrolyte.

5. The component defined in claim 1 wherein said second grid is disposed sufficiently close to said electrically activatable layer that space charge zones of said second grid reach said electrically activatable layer.

6. The component defined in claim 1 wherein said electrically activatable layer is provided as a quantum dot array.

\* \* \* \* \*